United States Patent
Gulla

(10) Patent No.: US 11,421,332 B2
(45) Date of Patent: Aug. 23, 2022

(54) ELECTROLYTIC CELL EQUIPPED WITH MICROELECTRODES

(71) Applicant: INDUSTRIE DE NORA S.P.A., Milan (IT)

(72) Inventor: Andrea Francesco Gulla, Shaker Heights, OH (US)

(73) Assignee: INDUSTRIE DE NORA S.P.A., Milan (IT)

(*) Notice: Subject to any disclaimer, the term of this patent is extended or adjusted under 35 U.S.C. 154(b) by 0 days.

(21) Appl. No.: 14/441,336

(22) PCT Filed: Nov. 8, 2013

(86) PCT No.: PCT/EP2013/073356
§ 371 (c)(1),
(2) Date: May 7, 2015

(87) PCT Pub. No.: WO2014/072458
PCT Pub. Date: May 15, 2014

(65) Prior Publication Data
US 2015/0308003 A1    Oct. 29, 2015

(30) Foreign Application Priority Data

Nov. 9, 2012  (IT) .......................... MI2012A001909

(51) Int. Cl.
*C25B 11/02*     (2021.01)
*C23C 14/18*     (2006.01)
(Continued)

(52) U.S. Cl.
CPC .............. *C25B 11/02* (2013.01); *C23C 14/18* (2013.01); *C23C 16/06* (2013.01); *C23C 16/278* (2013.01);
(Continued)

(58) Field of Classification Search
CPC ..... C25B 11/02; C25B 11/0405; C02F 1/4672
See application file for complete search history.

(56) References Cited

U.S. PATENT DOCUMENTS 3,914,164 A * 10/1975 Clark .................... C02F 1/4672
                                                           210/602
5,154,895 A    10/1992 Moon
(Continued)

FOREIGN PATENT DOCUMENTS

CA    2547373 A1    11/2007
EP    0728704 A2 *  8/1996 ........... B01D 53/501
(Continued)

OTHER PUBLICATIONS

Soh K. L., et al., "Diamond-derived microelectrodes array for electrochemical analysis", Diamond and Related Materials, Elsevier Science Publishers, Amerstam, NL, vol. 13, No. 11-12, Nov. 1, 2004, pp. 2009-2015.
(Continued)

*Primary Examiner* — Salil Jain
(74) *Attorney, Agent, or Firm* — Lucas & Mercanti, LLP

(57) ABSTRACT

The invention relates to an electrolytic cell equipped with microelectrodes for the generation of un-separated products and the method for obtaining it. The cell and the microelectrodes of the present invention are obtained using a technology for the production of microelectromechanical systems (MEMS). The anodic and cathodic microelectrodes have an electrocatalytic coating and are mutually intercalated at an interelectrodic gap lower than 300 micrometres.

9 Claims, 1 Drawing Sheet

(51) Int. Cl.
  *C23C 16/06*   (2006.01)
  *C23C 16/27*   (2006.01)
  *C23C 16/511*  (2006.01)
  *C25B 1/26*    (2006.01)
  *C25B 1/30*    (2006.01)
  *C25B 1/13*    (2006.01)
  *C25B 11/051*  (2021.01)

(52) U.S. Cl.
  CPC .............. *C23C 16/511* (2013.01); *C25B 1/13* (2013.01); *C25B 1/26* (2013.01); *C25B 1/30* (2013.01); *C25B 11/051* (2021.01)

(56) References Cited

U.S. PATENT DOCUMENTS

| | | | | |
|---|---|---|---|---|
| 5,403,680 A * | 4/1995 | Otagawa | ............... | H01M 4/60 204/192.1 |
| 6,093,302 A * | 7/2000 | Montgomery | ....... | B01J 19/0046 205/122 |
| 6,375,827 B1 | 4/2002 | Kurosu et al. | | |
| 2007/0193886 A1* | 8/2007 | Acworth | ............... | G01N 27/308 205/775 |
| 2008/0296173 A1* | 12/2008 | Mishra | ..................... | C25B 1/02 205/742 |
| 2009/0065938 A1* | 3/2009 | Takano | ............. | H01L 21/28575 257/750 |
| 2009/0120863 A1 | 5/2009 | Salama et al. | | |
| 2009/0152109 A1* | 6/2009 | Whitehead | ........... | G01N 27/307 204/400 |
| 2009/0321252 A1* | 12/2009 | Kato | ....................... | C25B 1/285 204/237 |
| 2010/0025234 A1* | 2/2010 | Hwang | ..................... | C25B 9/18 204/240 |
| 2010/0126879 A1* | 5/2010 | Wilman | ............... | C02F 1/46109 205/760 |
| 2011/0233075 A1* | 9/2011 | Soleymani | ......... | G01N 33/5438 205/792 |
| 2012/0024571 A1* | 2/2012 | Freeman | ............... | G01N 27/307 174/126.1 |
| 2012/0037505 A1* | 2/2012 | Pickles | ................. | G01N 27/308 204/400 |
| 2012/0149789 A1* | 6/2012 | Greenbaum | ........ | C01B 13/0207 518/704 |
| 2013/0105312 A1* | 5/2013 | Oliver | .................. | G01N 27/308 204/400 |
| 2013/0213823 A1* | 8/2013 | Arumugam | ........ | G01N 27/3278 205/794.5 |

FOREIGN PATENT DOCUMENTS

| | | |
|---|---|---|
| EP | 1630257 A1 | 3/2006 |
| WO | 2012006240 A1 | 1/2012 |
| WO | 2012078396 A2 | 6/2012 |

OTHER PUBLICATIONS

Kraft, "Doped Diamond: A Compact Review on a New, Versatile Electrode Material", Int. J. Electrochem. Sci., May 1, 2007, pp. 355-385.

Markus Pagels, et al., "All-Diamond Microelectrode Array Device", Analytical Chemistry, vol. 77, No. 11, Jun. 1, 2005, pp. 3705-3708.

International Search Report issued in PCT Application No. PCT/EP2013/073356.

International Preliminary Reporton Patentability issued in PCT Application No. PCT/EP2013/073356.

* cited by examiner

ELECTROLYTIC CELL EQUIPPED WITH MICROELECTRODES

This application is a U.S. national stage of PCT/EP2013/073356 filed on Nov. 8, 2013 which claims the benefit of priority from Italy Patent Application No. MI2012A001909 filed Nov. 9, 2012, the contents of each of which are incorporated herein by reference.

FIELD OF THE INVENTION

The invention relates to an electrolytic cell for the generation of non-separated products provided with microelectrodes and to a method for manufacturing the same. The cell and the microelectrodes of the present invention are obtained by semiconductor device manufacturing technologies used in the production of microelectromechanical systems (MEMS).

BACKGROUND OF THE INVENTION

The invention relates to an electrolytic cell which may be arranged in a monopolar or bipolar configuration, suitable for processes not requiring the separation of the products generated at the anodes and cathodes.

Methods and technologies for manufacturing semiconductor devices used in the production of microelectromechanical systems (MEMS), as well as lithographic techniques for the production of microelectrodes or straightforward deposition of catalytic metals for electrochemical reactions on substrates based on semiconductor materials are known in the art. Microelectrodes and methods for obtaining thereof by means of the above mentioned techniques and their application in electrolytic cells directed to water electrolysis are for instance described in WO2012078396. In such case, a process of water electrolysis through electrolytic cells equipped with microelectrodes is described, wherein the final products, hydrogen and oxygen, are separated. WO2012078396 also describes a pair of plates respectively having anodic and cathodic microelectrodes embedded therein whose interelectrodic gap, i.e. the distance between each pair of anodic and cathodic microelectrodes, despite the micrometric order of magnitude of microelectrode size, are of macroscopic order. This is because the two plates, respectively having anodic microelectrodes and cathodic microelectrodes incorporated therein, cannot be approached beyond a certain limit due to mechanical tolerances or to the thickness of diaphragms or membranes, when present, interposed between said plates. For this reason, the cell voltage can be limited within reasonable values at practically useful current density only if the resistivity of the electrolyte is sufficiently small. For the same reason, also in electrolytic cells of traditional type, that is, even where the electrodes have dimensions of a macroscopic order of magnitude, the cell voltage can be limited within acceptable values at practically useful current density only if the resistivity of the electrolyte is sufficiently small.

There are also known in situ ozone microgenerators, for instance such as described in US2009/0120863, disclosing ozone-producing circuits printed on one of the faces of a printed circuit board (PCB) provided with suitably roughened surfaces for the sake of increasing the size of hydrogen bubbles, thereby minimising recombination of product ozone with cathodically-evolved hydrogen, thus enhancing effective ozone production. Among other drawbacks, the rough cathodes of US2009/0120863 need to be periodically regenerated and for this purpose they are provided with heating elements arranged on the opposite face of the PCB. Additionally, the ozone generator of US2009/0120863 can only work with water starting from a minimum level of conductivity, e.g. spring or tap water, being not suitable for producing ozone from demineralised or deionised water.

The inventors have surprisingly found that electrolytic cells provided with multiplicities of anode and cathode microelectrodes in a single plate mutually intercalated at distances of the micrometric order can operate even with aqueous electrolytes of very high resistivity (low conductivity) producing ozone and mixed oxidants in quantities sufficient for use in various applications provided the microelectrode surfaces are extremely smooth, e.g. mirror-like. Furthermore, ozone-producing cells provided with mirror-like microelectrodes do not require any periodical regeneration, their ozone production rate being much higher so that the fraction of lost product due to recombination is not significant. Electrolytic cells provided with mirror-like microelectrodes can also be used for various purposes besides ozone and mixed oxidant generation. Such type of cell design cannot be obtained by means of conventional PCB techniques, but require advanced manufacturing techniques allowing a more sophisticated dimensional control such as a microelectromechanical system (MEMS) coupled with physical or chemical vapour deposition.

SUMMARY OF THE INVENTION

Various aspects of the invention are set out in the accompanying claims.

Under one aspect, the invention relates to an electrolytic cell for generation of unseparated anodic and cathodic products consisting of a of a lithographically-patternable substrate, for instance a silicon substrate, having a surface with a multiplicity of anodic microelectrodes and cathodic microelectrodes embedded therein, the anodic and cathodic microelectrodes being mutually intercalated at an interelectrodic gap lower than 100 micrometres and having an average surface roughness Ra lower than 0.05 µm. In one embodiment, the anodic and the cathodic microelectrodes have an average surface roughness Ra lower than 0.01 µm.

The term "embedded" into the surface of the substrate is used herein to mean that the microelectrodes are formed on the substrate surface in such a way that their external part is exposed for an effective contact with the aqueous electrolyte during operation.

The inventors have observed that the mirror-like smoothness of the electrode surface combined with the micrometric interelectrode gaps allows operating at effective current densities with a wide range of electrolytes, including very resistive electrolytes, i.e. having a very low conductivity, such as pure water or water with an extremely reduced content of ionic species. With microelectrodes having a suitably catalysed external surface it is surprisingly possible to produce a surprising amount and variety of species, e.g. oxidising species. Without wishing the invention to be limited to a particular theory, it can be assumed that the smoothness of the microelectrodes prevents reactions to take place on their whole surface and concentrates the current lines on their edges. The local current density becomes therefore so high around the microelectrode edges, especially with very resistive electrolytes, that the corresponding electrical potential triggers the onset of formation of a number of species (e.g. oxygen radical species) that would not be generated by the cells of the prior art.

The term "multiplicity of microelectrodes", as used herein, is meant to designate at least two microelectrodes.

The term "microelectrodes", as used herein, is meant to designate electrodes having dimensions in the micrometric order of magnitude, i.e. less than 100 micrometres.

In one embodiment, the electrolytic cell according to the invention has microelectrodes coated with an external layer consisting of a vacuum-deposited boron-doped diamond film. This can have the advantage of favouring the production of surprisingly reactive mixed oxidant species containing ozone at such a rate that the electrolytic cell becomes extremely effective in applications such as destruction of polluting organic species in aqueous solutions. In another embodiment, the electrolytic cell according to the invention has microelectrodes coated with an external layer made of a material containing an least one element selected from the group consisting of Pt, Pd, Ir, Ru, Rh, Nb and Ti. Coatings based on the above elements proved very effective in generating a number of desirable species such as hydrogen oxygen, hydrogen peroxide and ozone from various types of electrolytes. Chloride-containing electrolytes could also be treated to produce chlorine-containing species such as hypochlorite or nascent chlorine, for instance by coating the microelectrodes of the cell with Ru and Pd. Also the possibility to varying the compositions of the electrocatalytic layer of microelectrodes, differentiating microanode from microcathode composition, allows adjusting the reactivity of microelectrodes so as to produce different species.

In one embodiment, an intermediate layer of a metallic material selected from the group consisting of Co, Cr, Mo, W, Ni, Ti and alloys thereof is interposed between the external layer and the substrate; this can have the advantage of enhancing the adhesion of the external layer exposed to the electrolyte during cell operation to the substrate.

The substrate can be selected among the lithographically-patternable substrates of the prior art. It may be of semiconductive or insulating nature, flexible or rigid, and may include inorganic—for example silicon-based—or organic compositions, for example polymers of different nature. The term "lithographically-patternable substrate" is used herein to designate a substrate that can be treated by advanced lithographic techniques such as MEMS to form microelectrodes of defined size and geometry according to a predetermined pattern, e.g. a multiplicity of electrically connected finger-shaped anodes suitably intercalated to a multiplicity of electrically connected finger-shaped cathodes at a predetermined interelectrodic gap according to an interdigitated geometry. Optionally, the silicon-based substrate comprises a 200 to 400 µm thick Si layer topped with a 0.5 to 2 µm thick $SiO_2$ layer.

Under another aspect, the invention relates to a method of manufacturing an electrolytic cell as hereinbefore described comprising the steps of:

providing a substrate with fingers according to a predefined pattern by a lithographic technique.

optionally coating the fingers with a layer of a metal selected from the group consisting of Co, Cr, Mo, W, Ni, Ti and alloys thereof by vapour phase physical or chemical deposition technique (PVD or CVD)

applying an external electrode layer by vapour phase physical or chemical deposition technique upon said metal-coated fingers.

In one embodiment, the external electrode layer comprises a material containing at least one element selected from the group consisting of Pt, Pd, Ir, Ru, Rh, Nb and Ti. In another embodiment, the external electrode layer is a boron-doped diamond film applied by microwave-assisted chemical vapour deposition. In another embodiment, the external layer is a boron-doped diamond film containing at least 5000 ppm of boron doping.

In one embodiment, the substrate is provided with fingers according to a predefined pattern by means of a lithographic technique selected between MEMS photolithography and MEMS laser etching technique or a combination of the two.

Under a further aspect, the invention relates to a method for the production of oxidising mixtures at variable composition comprising the programmed application of different current densities through an microprocessor integrated to a cell as hereinbefore described.

The invention therefore also relates to method for the production of oxidising mixtures at variable composition according to the invention containing at least one species selected between ozone, oxygen radicals, nascent oxygen, peroxides, hypochlorite ion and nascent chlorine. This can have the advantage of making the cell of the invention useful in various applications in the field of sterilisation and disinfection such as sterilisation of medical equipment, water purification, sterilisation of water in washing machines and so on.

Under a further aspect, the invention relates to a device for dispensing sterilising, disinfecting or detergent substances equipped with at least one cell according to the invention.

Some implementations exemplifying the invention will now be described with reference to the attached drawings, which have the sole purpose of illustrating the reciprocal arrangement of the different elements relatively to said particular implementations of the invention; in particular, drawings are not necessarily drawn to scale.

DETAILED DESCRIPTION OF THE DRAWINGS

Figure 1:
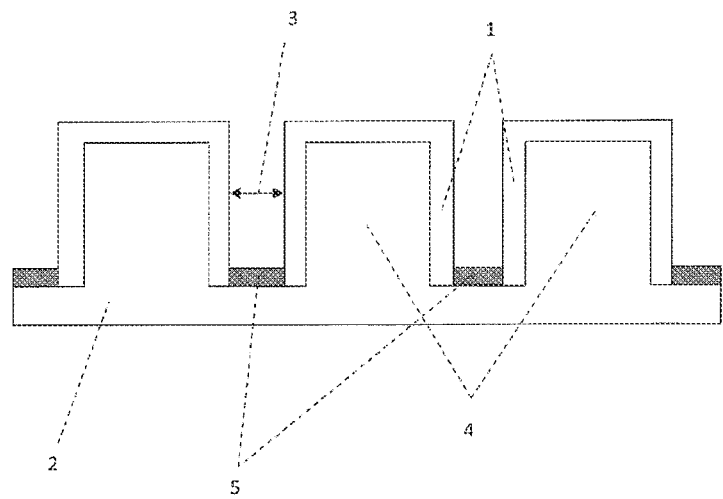
FIG. 1 shows a sectional view of a plurality of anodic and cathodic microelectrodes embedded in the same substrate according to an embodiment of the invention.

In FIG. 1 there is shown a sectional view of an embodiment of the invention which consists of a multiplicity of microelectrodes 1, which can be anodic microelectrodes and cathodic microelectrodes embedded in the same substrate lithographically-patterned with interdigitated geometry 2 at an interelectrodic gap 3. Anodic and cathodic microelectrodes 1 are deposited on the walls of fingers 4 which are formed as a result of the lithographic patterning. The area 5 that separates the anodic microelectrodes from the cathodic microelectrodes is suitably made of insulating material.

Figure 2:
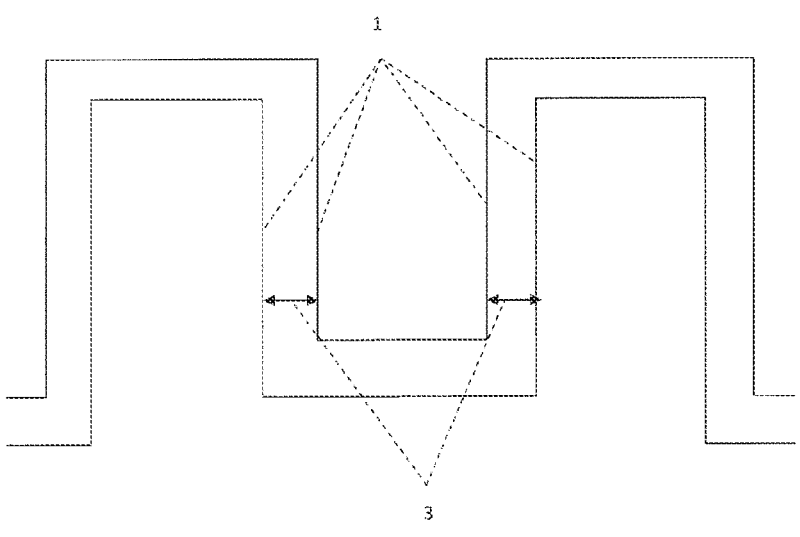
FIG. 2 shows a top view of a plurality of anodic and cathodic microelectrodes embedded in the same lithographically-patterned substrate with interdigitated geometry and corresponding interelectrodic gaps according to one embodiment of the invention.

In FIG. 2 there is shown a top view of an embodiment of the invention consisting of a multiplicity of microelectrodes 1 embedded in a lithographically-patterned substrate with interdigitated geometry at an interelectrodic gap 3.

The following examples are included to demonstrate particular embodiments of the invention, whose practicability has been largely verified in the claimed range of values. It should be appreciated by those of skill in the art that the compositions and techniques disclosed in the examples which follow represent compositions and techniques discovered by the inventors to function well in the practice of the invention; however, those of skill in the art should, in light of the present disclosure, appreciate that many changes can be made in the specific embodiments which are disclosed and still obtain a like or similar result without departing from the scope of the invention.

EXAMPLE 1

On a silicon wafer of circular shape having a diameter of 200 mm and a thickness of 2 mm and provided with a 1 µm thick $SiO_2$ top layer, an interdigitated pattern was transferred via MEMS photolithography. The surface of the wafer was then subjected to etching with 30% KOH for 15 minutes at room temperature. On the wafer thus obtained, suitably provided with an insulating screen according to the selected microelectrode pattern, a layer of titanium was deposited by means of physical vapour deposition (PVD). Subsequently an electrocatalytic layer of platinum was deposited, again by physical vapour deposition, in two instances: a first deposition maintaining the main axis of the substrate (target) tilted 45 degrees from the plane, so as to deposit the electrocatalyst on a first face of the fingers patterned on the substrate, and a second instance maintaining the substrate tilted 45 degrees from the plane in the opposite direction so as to deposit the electrocatalyst on the second face of the patterned fingers. A post-production heat treatment of the microcell was carried out in argon-purged atmosphere at 500° C. for 1 hour with a 5° C./min temperature ramp. Other kinds of inert or reducing environments, such as a hydrogen-purged atmosphere, may be suitable for the heat treatment step. An interelectrodic gap of 100 micrometres and an average electrode surface roughness Ra of 0.01 µm were determined by laser techniques.

In the cell thus obtained, tested with an aqueous solution of KOH at 60 ppm concentration, at a current density of 40 $mA/cm^2$ and cell voltage of 5 V, a current efficiency for the production of ozone of 5% was measured.

EXAMPLE 2

On a silicon wafer of circular shape having a diameter of 200 mm and a thickness of 2 mm and provided with a 1 µm thick $SiO_2$ top layer, a boron-doped diamond film was grown directly on the $SiO_2$ using microwave-assisted chemical vapour deposition (CVD) and laser etching resulting in approximately 6 µm thick electrodes with a boron doping level of 6000 ppm. An interelectrodic gap of 86 micrometres and an average electrode surface roughness Ra of 0.02 µm were determined by laser techniques.

In the cell thus obtained, tested with an aqueous solution of KOH at 60 ppm concentration, at a current density of 40 $mA/cm^2$ and cell voltage of 5 V, a current efficiency for the production of ozone of 4% was measured.

EXAMPLE 3

The cell described in Example 2 was tested for electrochemical oxidant production and EOD (Electrochemical Oxygen Demand) treatment using a methyl orange solution in tap water at 5, 10 and 25° C.

125 ml of quiescent tap water containing $10^{-5}$ M methyl orange were treated at 9 $kA/m^2$ for one hour. The UV absorption of the solution was measured before and after the treatment, showing an 80 to 85% reduction at the three temperatures. Besides the magnitude of the result, the fact that the efficiency of EOD treatment is not temperature-dependent in such conditions is surprising and indicates that the cell is not merely producing ozone. The tests were in fact repeated while measuring the rate of ozone production, which was several times higher at 5° C. as expected (about 1.2 mg/l vs. 0.2 at 25° C.). The above results indicate that an oxidant species more active than ozone is produced by the cell in these conditions, much likely a short-lived oxygen radical species, not detectable with available techniques.

The previous description shall not be intended as limiting the invention, which may be used according to different embodiments without departing from the scopes thereof, and whose extent is solely defined by the appended claims.

Throughout the description and claims of the present application, the term "comprise" and variations thereof such as "comprising" and "comprises" are not intended to exclude the presence of other elements, components or additional process steps.

The discussion of documents, acts, materials, devices, articles and the like is included in this specification solely for the purpose of providing a context for the present invention. It is not suggested or represented that any or all of these matters formed part of the prior art base or were common general knowledge in the field relevant to the present invention before the priority date of each claim of this application.

The invention claimed is:

1. Electrolytic cell for generation of oxidizing radical species consisting of:
    a lithographically patterned substrate consisting of a surface,
    a multiplicity of finger shaped anodic and cathodic microelectrodes embedded into said surface, said anodic and cathodic microelectrodes being mutually intercalated at an inter-anodic-cathodic gap lower than 100 micrometres and said anodic and cathodic microelectrodes having an average surface roughness $R_a$ lower than 0.05 µm, and
    an electrolytic solution,
wherein the multiplicity of finger shaped anodic and cathodic microelectrodes embedded on said surface are boron-doped diamond, and wherein the electrolytic cell generates oxidizing radical species.

2. Electrolytic cell according to claim 1 wherein said average surface roughness $R_a$ of the anodic and cathodic microelectrodes is lower than 0.01 µm.

3. Electrolytic cell according to claim 1 wherein said lithographically-patternable substrate is made of a semiconductor material.

4. Electrolytic cell according to claim 1, wherein the boron-doped diamond contains at least 5000 ppm of boron doping.

5. Electrolytic cell for generation of oxidizing radical species consisting of:
    a lithographically patterned substrate consisting of an interdigitated surface;
    a multiplicity of finger shaped anodic and cathodic microelectrodes formed surrounding each digit of said interdigitated surface, said anodic and cathodic microelectrodes being mutually intercalated at an inter-anodic-cathodic gap lower than 100 micrometres and said anodic and cathodic microelectrodes having an average surface roughness $R_a$ lower than 0.05 µm, and
    an electrolytic solution,
wherein the electrolytic cell generates oxidizing radical species.

6. Electrolytic cell according to claim 5, wherein said average surface roughness $R_a$ of the anodic and cathodic microelectrodes is lower than 0.01 µm.

7. Electrolytic cell according to claim 5, wherein at least said anodic microelectrodes comprise an external layer consisting of a vacuum-deposited boron-doped diamond film.

8. Electrolytic cell according to claim 5, wherein said microelectrodes comprise an external layer made of a material containing at least one element selected from the group consisting of Pt, Pd, Ir, Ru, Rh, Nb and Ti.

9. Electrolytic cell according to claim 5, wherein said lithographically-patternable substrate is made of a semiconductor material.

* * * * *